United States Patent [19]
Heuber et al.

[11] 4,334,294
[45] Jun. 8, 1982

[54] RESTORE CIRCUIT FOR A SEMICONDUCTOR STORAGE

[75] Inventors: Klaus Heuber, Beoblingen; Siegfried K. Wiedmann, Stuttgart, both of Fed. Rep. of Germany

[73] Assignee: International Business Machines Corporation, Armonk, N.Y.

[21] Appl. No.: 167,560

[22] Filed: Jul. 11, 1980

[30] Foreign Application Priority Data

Jul. 20, 1979 [DE] Fed. Rep. of Germany ....... 2929384

[51] Int. Cl.$^3$ .............................................. G11C 7/00
[52] U.S. Cl. .................................. 365/203; 307/238.3
[58] Field of Search .............................. 365/174, 203; 307/238.3

[56] References Cited

U.S. PATENT DOCUMENTS

| | | |
|---|---|---|
| 3,057,789 | 10/1962 | Spadavecchia et al. |
| 3,540,010 | 11/1970 | Heightley et al. |
| 3,789,243 | 1/1974 | Donofrio et al. |
| 4,070,656 | 1/1978 | Heuber et al. |
| 4,075,609 | 2/1978 | Millhollan et al. |
| 4,090,255 | 5/1978 | Berger et al. |
| 4,122,548 | 10/1978 | Heuber et al. |
| 4,156,941 | 5/1979 | Homma et al. |
| 4,280,198 | 7/1981 | Heuber et al. ........................ 365/203 |

FOREIGN PATENT DOCUMENTS

| | | |
|---|---|---|
| 13302 | 7/1980 | Fed. Rep. of Germany. |
| 11700 | 6/1980 | France. |

OTHER PUBLICATIONS

IBM-TDB, vol. 13, No. 6, Nov. 1971, S. K. Weidman, pp. 1705-1706.
IBM-TDB, vol. 14, No. 6, Nov. 1971, R. D. Moore, pp. 1687-1688.
IBM-TDB, vol. 22, No. 10, Mar. 1980, K. Heuber et al., pp. 4606-4607.
IEEE Jrnl. Solid State Circuits, vol. SC-13, No. 5, Oct. 78, K. Kawarda et al., pp. 656-663.

*Primary Examiner*—James W. Moffitt
*Attorney, Agent, or Firm*—Theodore E. Galanthay

[57] ABSTRACT

Disclosed is a restore circuit for restoring an integrated semiconductor storage array having storage cells consisting of bipolar transistors. The restore circuit includes a reference voltage generator, an impedance converter, and switches to connect the reference voltage generator and the impedance converter to the storage array. The reference voltage generating circuit includes a current source and at least one reference storage cell identical in construction to the storage cells of the array. The reference voltage generating circuit provides a reference voltage to the impedance converter which supplies a second reference voltage to the array at a greatly reduced impedance. The equivalent circuit of the storage cells is that of a capacitor in parallel with a diode. Thus, the impedance converter provides an initial surge of capacitive current which restores the cells, followed by a standby current which is a function of the diode characteristics of the cell equivalent circuit.

2 Claims, 4 Drawing Figures

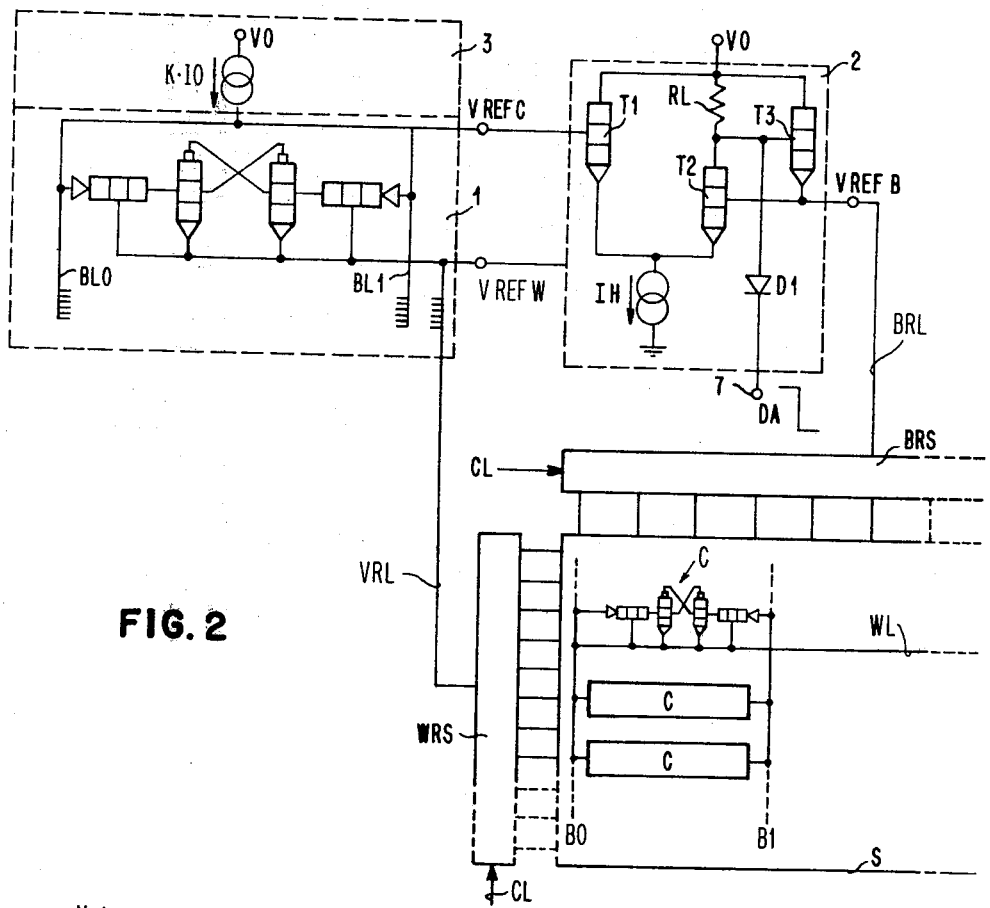
FIG. 2
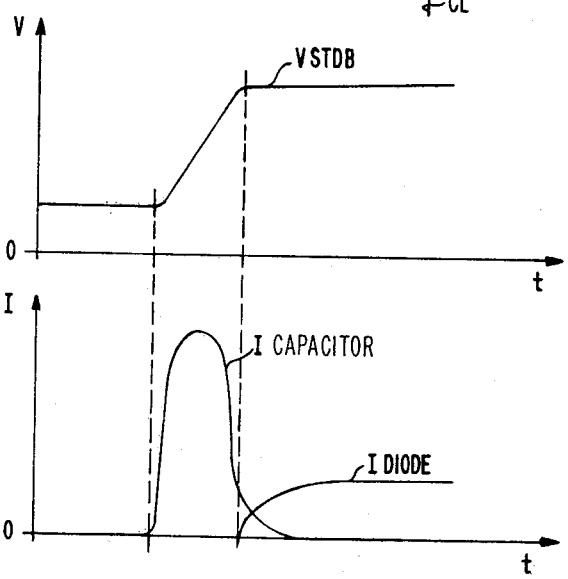
FIG. 3A
FIG. 3B

RESTORE CIRCUIT FOR A SEMICONDUCTOR STORAGE

DESCRIPTION

CROSS REFERENCES

1. IEEE, Journal of Solid State Circuits, Vol. SC/7, No. 5, October 1972.
2. U.S. Pat. No. 3,736,477.
3. U.S. Pat. No. 3,816,758.
4. German Pat. No. 25 11 518.
5. German Pat. No. 26 57 561.

BACKGROUND OF THE INVENTION

1. Field of the Invention

This invention relates to a restore circuit for a semiconductor integrated storage.

2. Description of the Prior Art

In the past few years, there have been many developments in the field of logic arrays and integrated semiconductor storage technology with bipolar transistors, which are referred to as MTL (Merged Transistor Logic) or I$^2$L (Integrated Injection Logic). In this regard, attention is drawn, for example, to the referenced article in the IEEE Journal of Solid State Circuits, Vol. SC/7, No. 5, October 1972, pp. 340 ff. and 346 ff. Storage cells in MTL technology are also known from U.S. Pat. No. 3,736,477 and U.S. Pat. No. 3,816,758.

These semiconductor storage arrays, whose storage cells are made up of bipolar transistors in MTL technology, have extremely short switching times and are particularly suitable for extremely highly integrated storage arrays and logic circuit groups. After a read or write operation, the bit lines of MTL storage arrays have to be restored in an address cycle to the same voltage potential, if possible, which necessitates a restore operation. For this purpose, different methods and circuit arrangements have been proposed. From German Pat. No. 25 11 518, for example, a solution is known which by means of a particular structure of the peripheral circuits and the read/write phases on the one hand and the restore and refresh phases on the other leads to a reduction in the cycle time at low storage cell currents, without changing the storage cell. This is accomplished mainly by externally controlling the bit line currents during the selection phase in which information is read from or written into the storage cells. The higher bit line currents occurring during the restore phase are used to change the cell node potentials to such values at which a storage cell is not affected by the read/write operations of adjacent storage cells.

Although this solution leads to a high-speed semiconductor storage with low power consumption, it has the disadvantage that the current flowing into the word line in the selected state is still too high and that, in addition, the bit line levels are such that an adjacent semiselected storage cell may be rewritten when a read/write process on a defective cell in the storage array is in progress.

Another known restore circuit is described in German Pat. No. 26 57 561. Characteristics of this restore circuit are: that a standby reference circuit is controlled by a clocked signal via a restore control line, that an error case reference circuit is connected to the standby reference circuit, and that both circuits are connected to the restore circuits via a reference line, that the levels of the voltages on the bit lines are determined in the standby state by the current flowing through two current sources which are directly connected to the bit lines and the decoupling diodes designed as Schottky diodes, the latter being connected to the reference line by means of a common cathode terminal. Although this reference teaches a restore reference circuit for the standby state and for the error case, it cannot be used for integrated storages with MTL storage cells, since such storages are subject to an additional problem, as will now be described.

For reading the information stored in an MTL storage cell, its word line potential is lowered by several 100 mV and simultaneously a read current is applied through each of the two selected bit lines. (Each cell is connected to a bit line pair B0 and B1.) As the emitter to base voltages of the PNP transistors of all unselected storage cells are about 0.5 V lower than the emitter to base voltage of the selected cell, practically the full read current flows into the selected storage cell. A result of this is that the emitter base voltage of one PNP transistor is higher than that of the other. The voltage difference is sensed by the sense amplifier which receives a differential input from the bit line pair. If all unselected cells n have stored a zero, then there is a reinjection current $I \sim \frac{1}{8} 10 \times n$, where 10 is the standby injection current of the storage cell, even though the injector current is practically switched off. Because of the high depletion layer capacitance, this reinjection current decays very slowly. To prevent this parasitic read current from greatly influencing the read process, the read current of the selected cell must be high compared to the parasitic reinjection current of the unselected cells. For this reason, the standby current of the storage cell must be kept at a very low value which in accordance with the technology presently employed is approximately between 10 and 100 nA. Although this leads to a very low storage standby power, there are great difficulties with regard to the restore operation. To insure on the one hand that the non-selected cells receive a current of adequate magnitude when the storage chip is permanently selected and on the other hand that the standby current does not interfere with the read process, an extremely accurate bit line restore operation would have to be performed. Overloading, as is usual elsewhere, is not possible in this case.

SUMMARY OF THE INVENTION

Therefore, it is a principal object of this invention to provide an improved restore circuit arrangement and more particularly, one which does not require the generation of an accurate restore clock pulse.

In accordance with the present invention, a storage array is restored and a standby current is provided by the same circuitry including a reference voltage generating circuit, an impedance converter, and word line/bit line pair restore switches connected to the array.

The reference voltage generator includes a current source and at least one reference storage cell and provides a first reference voltage (VREFC) as an output. This first reference voltage is an input to the impedance converter, which provides a second reference voltage (VREFB), at very low output impedance, to the bit-line restore switches (BRS). The word-line restore switches (WRS) receive a third reference voltage (VREFW) in the order of 0.7 V from a suitable reference voltage generator, which can be part of the impedance converter or a separate voltage source.

When the restore switches are first turned on, the array presents a capacitive load. The low output impedance of the impedance converter results in a large initial surge of restore current, in effect charging the capacitance. This capacitive current is only a brief impulse, immediately followed by a lower amplitude steady-state standby current which is a function of the applied reference potentials and the diode characteristics of the storage load devices in the array. The restore current surge and subsequent steady-state standby current are thus provided in correct time sequence without the generation of an accurate restore clock pulse.

The foregoing and other objects, features, and advantages of this invention will be apparent from the following and more detailed description of a preferred embodiment of the invention as illustrated in the accompanying drawings.

BRIEF DESCRIPTION OF THE DRAWINGS

FIG. 2 shows a detailed circuit for the restore circuit.

FIGS. 3A and 3B are timing diagrams of the restore voltage and current.

DESCRIPTION

Figure 1:
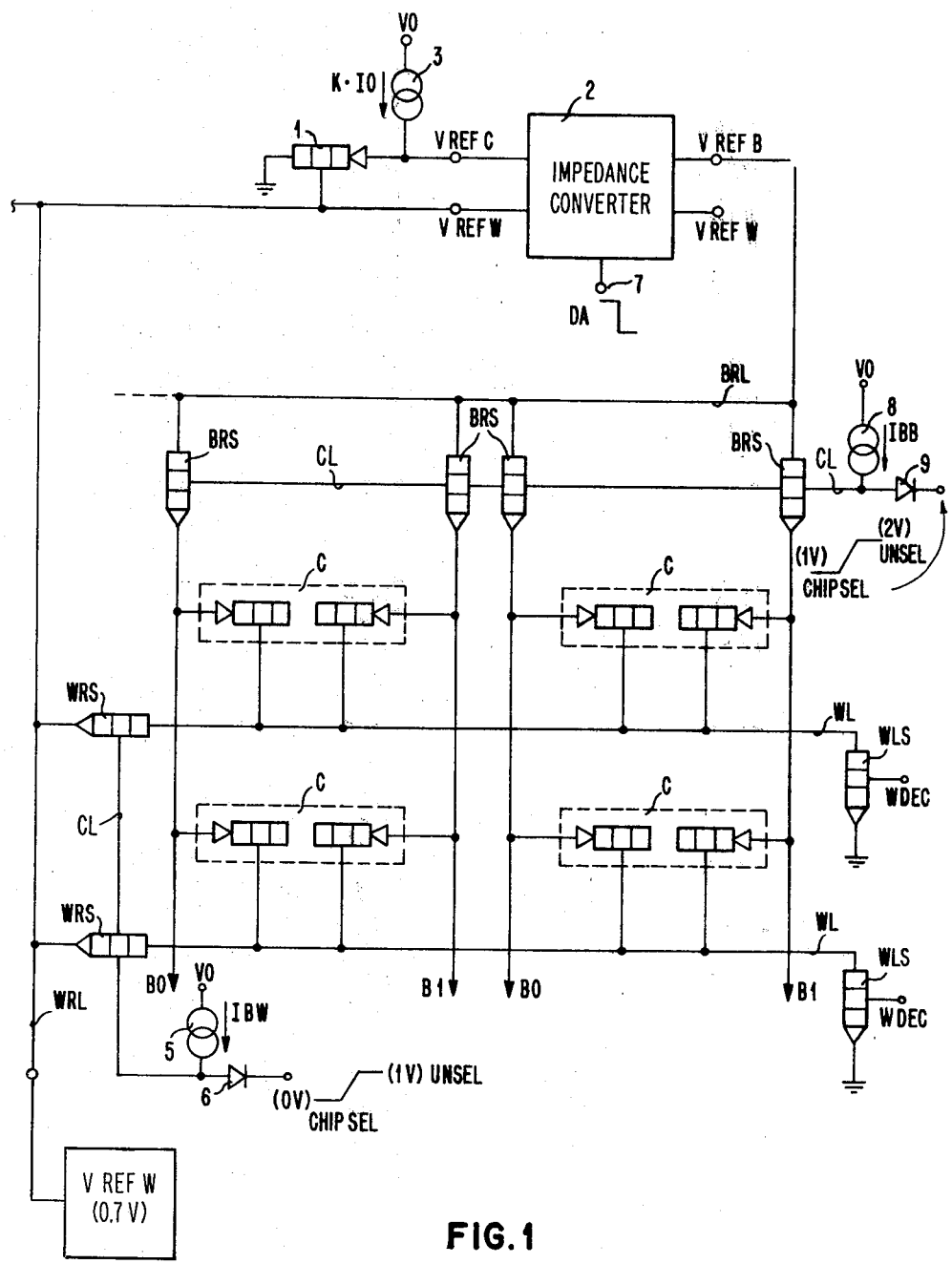
FIG. 1 shows a section of a storage array chip with schematic storage cells and the circuits required for the restore operation.

Before describing in detail the circuits in accordance with FIGS. 1 and 2, the essential features of the invention will be explained.

In place of a constant restore current, as used in the prior art, the circuits shown in FIGS. 1 and 2 are operated by means of an impressed voltage source (very small internal resistance), the output voltage of which is accurately adjusted by a group of reference storage cells and which loads the equivalent capacitance diode load (equivalent circuit) of the storage matrix to its steady-state value. The voltage source is deactivated during the chip select phase. The cell standby current is supplied by the same voltage source as the restore current. A clock pulse is not required, since the restore current adjusts itself to the cell standby current automatically and at high speed.

The circuit arrangement of this invention has the advantage that instead of a constant restore current, an impressed voltage source is used which has a very low internal resistance, the output voltage of which is accurately adjusted by a group of reference storage cells in such a manner that the capacitance diode load of the integrated storage cell matrix is loaded to its stationary value. The voltage drops on the lines and switches, which are caused by the restore current, are extremely small shortly before the stationary cell voltage is reached, so that the cell current can be accurately adjusted. The high restore peak current permits very fast restoring. Further advantages are: that all this can be achieved at the same time, that the number of circuit elements required for effecting the restore operation are very few, and that no special tolerance requirements have to be met during manufacture.

FIG. 1 is a schematic representation of a storage matrix, showing the equivalent circuit of four storage cells C in MTL technology. Note that only the PNP load devices are shown as the equivalent circuit for restore and standby operation—the crosscoupled NPN transistors are not shown to simplify the description. The storage cells C are connected to a bit reference line BRL as well as to a current source 8 for the current IBB and to a diode 9 to which the chip select signal CHIP SEL is applied, by means of bit restore switches (BRS) and the bit lines B0 and B1. Via an impedance converter 2, k reference storage cells are connected to the bit reference line BRL. The reference storage cells are schematically represented by the transistor 1 which is fed by a current source 3. The impedance converter 2 is switched off during the selection phase by a signal DA at input 7. The impedance converter 2 has a low-resistance output, insuring that an accurate reference voltage VREFC=VREFB is supplied. After the voltages have been applied to the diodes (i.e. PNP load devices) of the storage cells C via the bit reference line BRL, the word reference line WRL, as well as via the bit restore switches BRS and the word restore switches WRS, the standby current occurs automatically. The transient is effected at maximum speed and is determined by the output impedance of the impedance converter 2.

On the word line side, the storage matrix is controlled by diode 6, to whose input the CHIP SEL signal is applied, and via a current source 5, which are both connected to the base of the word restore switches WRS. The word restore switches WRS are connected to the word lines WL by means of their collector electrode and to a word reference voltage line WRL by means of their emitter. The potential VREFW applied to the latter line is identical with the potential VREFW which is applied to the equivalent circuit diagram for the reference storage cells 1. On the right hand side, the word lines end in one word line switch WLS each, the emitter of which is connected to ground and the base of which is connected to a word decoder (not shown).

The diagram of FIG. 2 shows the actual reference storage cells 1 and the storage cells C in the storages, which is schematically represented in the lower part of FIG. 2. It is a significant aspect of this invention that the reference storage cells and array storage cells are identically constructed. The reference storage cells 1 are preceded by a current source 3 supplying the current K.IO which is equal to k×IO, where factor k is the number of reference storage cells 1 and IO is the standby current per cell. The number of reference storage cells 1 may range from one storage cell to up to 20 percent of the storage cells C in the storage array, depending upon the size of the array, the standby current, and the design of the impedance converter 2.

The information storage is equipped with restore switches WRS on the word-line side and BRS on the bit line side, respectively. These restore switches are controlled via the illustrated control lines CL and are connected to the reference storage cells 1 via the word reference line WRL and to the output of the impedance converter 2, serving as a voltage source, via the bit reference line BRL.

The input of impedance converter 2 is connected to the reference storage cells 1 and is additionally provided with a control input 7 to which the signal DA is applied. The impedance converter 2 includes first and second transistors T1 and T2, the emitters of which are connected to each other and which are connected to a common current sink for the current IH. The collectors of the two transistors T1 and T2 are connected to a voltage VO, a resistor RL being arranged between the collector of the transistor T2 and the input point for the voltage VO. VO is the most positive voltage in this arrangement. The collector of a third transistor T3, which can be controlled from the output of the transistor T2 and by means of the control signal DA via a diode D1, is also connected to the voltage point VO. The emitter of third transistor T3 is connected to the base of the transistor T2, and provides the output of the impedance converter 2.

The circuit operation is best described by first considering the standby state. In this state, the bit and word reference switches BRS and WRS are conductive, so that the standby current flows through each storage cell C. The bit and word reference switches BRS and WRS are designed as quasi-ideal switches and have a very low residual voltage. The current source 3 above the reference storage cells 1 also supplies the standby current for the storage cells C. The k reference storage cells 1 emit the cell reference voltage VREFC at their output, amplification being effected by the impedance converter 2 following said cells. In this case, the impedance converter 2 is designed as a feedback circuit. It is, of course, also possible to use other known circuits. When the control signal DA at its high level at the control input 7, the input voltage VREFC equals the output voltage of the impedance converter 2, i.e., VREFB=VREFC.

The standby state is followed by selection phase during which the control signal DA at the input 7 of the impedance converter 2 is at its low level. This means, the impedance converter 2, acting as a reference amplifier, is switched off, so that storage cells C can be selected in the information storage S. Without this operation, a bit line discharge could not be effected. After this selection phase, reading and writing takes place in the conventional and well known manner for MTL storage arrays.

This is followed by the restore phase described below. It is assumed that the bit lines B0 and B1 are discharged, i.e., the voltage at the storage cells C in the information storage S is about 400 mV lower than the voltage at the reference cells 1. As the standby current flows through the reference cells 1, there is practically no current flow in the storage cells C. For the restore operation, the storage cells C have the characteristic of a circuit consisting of a diode connected parallel to a capacitor.

The restore operation is provided by applying an impressed voltage to the discharged storage cells C. The current I capacitor is generated by the current source with the maximum current supply, and the appropriate cell current occurs very rapidly. Subsequently, standby current flows. To a high-speed restore operation the following applies:

---
I capacitor:I diode
20:1
---

The smaller the standby current and the greater the array, the higher the ratio

I capacitor> >I diode.

At the end of the restore operation, the standby current (I diode=I standby, I capacitor=O) flows through the storage cells C to be restored. FIG. 3A shows the cell voltage curve during the restore operation. FIG. 3B shows the cell current curve of the current I capacitor and the current I diode.

As may be seen from FIG. 3A, the curve of the cell restore voltage, which is a function of the design of the impedance converter 2, is such that after selection, there is a relatively steep rise to the standby voltage VSTB of the storage cell, the curve showing a sharp break in the upper part of the voltage.

FIG. 3B shows the curves of the currents I capacitor and I diode. As mentioned above, the maximum I CAPACITOR is a function of the current supply of the impedance converter, which in turn determines the maximum voltage increase. Because of the low output impedance characteristic of the impedance converter, the voltage rises rapidly close to the final value, assuming its static level with a sharp break. As a result, a current I diode occurs in due time, rising rapidly to the standby value.

The reference storage cells 1 and information storage cells C in MTL technology used for the embodiment described may, of course, be replaced by other storages with bipolar transistors, the cells of which use high-resistance resistors or NPN transistors as load elements.

This circuit with voltage impression provides a very high peak current at the beginning of the restore phase, very rapidly charging the storage cell capacitances. However, this peak current decays very rapidly, so that shortly before the steady-state cell standby voltage is reached, its value is very low, thus permitting the cell voltage to be accurately adjusted. As a result, no special time control pulses are needed for the control of the restore current and the number of required circuit elements are few. In addition, the voltage drops caused at the lines and switches by the restore current are very small, so that adjustment to the steady-state cell standby voltage is not detrimentally affected. Because of the high peak current, the time for the restore operation is very short, so that the access time to a storage of the kind described above can be considerably reduced by means of the circuit described.

While we have illustrated and described the preferred embodiment of our invention, it is to be understood that we do not limit ourselves to the precise construction herein disclosed and the right is reserved to all changes and modifications coming within the scope of the invention as defined in the appended claims.

We claim:

1. A circuit for restoring an integrated semiconductor storage array having storage cells consisting of bipolar transistors (and PNP load devices) at cross-points of word lines and bit line pairs comprising:

a reference voltage generator circuit including a current source connected to at least one reference storage cell and providing a first reference voltage;

impedance converting means connected to said reference voltage generating circuit and receiving as an output said first reference voltage and providing a second reference voltage at a low impedance output;

first switch means connecting said second reference voltage, by means of said bit line pairs to the PNP load devices of the array storage cells;

second switch means for connecting a third reference voltage, by means of said word lines, to the array storage cell load devices, said third reference potential also being connected to the at least one reference storage cell in the reference voltage generating circuit.

2. A circuit as in claim 1 wherein said impedance converting means comprises:

first, second, and third transistors each having base, emitter, and collector regions, the emitters of the first and second transistors being connected in common and to another current source, the collector of the second transistor being connected to the base of the third transistor, the base of the second transistor being connected to the emitter of the third transistor, the collector regions of the first and third transistors being connected in common and to a voltage source, the base of the first transistor receiving the first reference voltage from the reference voltage generating circuit, the emitter of the third transistor providing the second reference voltage as an output of the impedance converter; and unidirectionally conducting means connected to the base of the third transistor with a control terminal attached to the unidirectionally conducting means controlling the on and off state of said third transistor.

* * * * *